United States Patent

[11] 3,557,383

[72] Inventors Andre Wavre
Monroeville;
Francis T. Thompson; Tibor D. Rubner,
Pittsburgh, Pa.

[21] Appl. No. 672,156
[22] Filed Oct. 2, 1967
[45] Patented Jan. 19, 1971
[73] Assignee Westinghouse Electric Corporation
Pittsburgh, Pa.
a corporation of Pennsylvania

[54] CONTROL LOGIC CIRCUIT
9 Claims, 5 Drawing Figs.

[52] U.S. Cl. .......... 307/215, 307/235, 307/293; 328/167
[51] Int. Cl. .......... H03k 3/26
[50] Field of Search .......... 307/215, 201, 235, 293, 211, 295; 328/167

[56] References Cited
UNITED STATES PATENTS

| | | | |
|---|---|---|---|
| 3,293,609 | 12/1966 | Martin | 307/201 |
| 3,351,783 | 11/1967 | Harris | 307/201 |
| 3,358,154 | 12/1967 | Hung | 307/215 |
| 3,416,130 | 12/1968 | Brochelt | 307/293 |
| 3,435,258 | 3/1969 | McAvoy | 307/293 |
| 3,452,216 | 6/1969 | Hirsch | 307/215 |

*Primary Examiner*—Donald D. Forrer
*Assistant Examiner*—David M. Carter
*Attorneys*—F. H. Henson, E. P. Klipfel and D. Schron

ABSTRACT: A universal logic gate for fabrication as an integrated circuit includes a first input section and a second input section each of which may be selectively chosen for connection to an inverting or output stage. The circuit includes a threshold means so that the response of the output stage is limited to certain signals within predetermined binary voltage ranges. In one embodiment the threshold means takes the form of a biased transistor, and in another embodiment takes the form of a voltage breakdown diode. The circuit also includes a low pass filter network to provide a time delay such that the output stage responds to the input signals only after a predetermined time delay. With fabrication as an integrated circuit, terminal connections are provided such that an external capacitor for governing the time delay may be connected.

WITNESSES
Theodore F. Wrobel
James F. Young

INVENTORS
André Wavre, Francis T. Thompson
and Tibor D. Rubner
BY Dean Schron
ATTORNEY

PATENTED JAN 19 1971 3,557,383

CONTROL LOGIC CIRCUIT

BACKGROUND OF THE INVENTION

1. Field of the Invention

The invention in general relates to control logic circuits and in particular to the field of industrial control and an industrial static control logic circuit therefor.

2. Description of the Prior Art

The increasing complexity of industrial control problems requires the use of components with higher reliability, and as such, the generally utilized electromechanical relay is being replaced by solid state circuitry, including integrated circuits wherein a plurality of electronic circuit components are fabricated on a single semiconductor chip. The introduction of integrated circuits in industrial control applications raises various problems which existing integrated logic circuits find difficulty in overcoming.

In industrial control systems there exist extraneous and unwanted signals called noise and caused for example, by the machinery being controlled, or the distributed capacitance and inductance along power and signal lines associated with the system. Presently available integrated circuits used in various logic networks tend to respond erroneously when utilized in industrial control applications due to the presence of high frequency noise or extraneously generated random voltages on the signal lines.

It is a general object of the present invention to provide an improved logic circuit for industrial control applications wherein the circuit is relatively immune from noise and is particularly well adapted to be fabricated as an integrated circuit.

SUMMARY OF THE INVENTION

A logic circuit is provided and includes an input section which receives a plurality of input logic signals, and an output section which is responsive to the input signals to provide an output signal as a function of predetermined combinations of the input signals. Such response may be the commonly known NAND or NOR type of operation.

When fabricated as an integrated circuit the input section may include a first and second plurality of diodes with the first plurality being for the NAND function and the second plurality being for the NOR function with the diodes having a commonly connected electrode connected to a respective terminal for the NOR and NAND function whereby an external connection may be made for selectively choosing the NAND or NOR diodes.

Interposed between the input and the output section is a threshold means which limits the response of the output section to only those input signals above a predetermined threshold value such that the circuit is insensitive to high voltage noise. The control circuit additionally includes a time delay means in the form of a low pass filter network interposed between the input and output sections for delaying, for a predetermined time duration, the response of the output section to the input signals in order to provide proper immunity from high frequency noise signals. The filter network includes a capacitor element which may be external to the integrated circuit and may be connected to properly provided filter network terminals such that by selectively choosing the value of capacitor the time delay may be varied accordingly.

BRIEF DESCRIPTION OF THE DRAWINGS

In FIG. 1 the control logic circuit is shown incorporated into an integrated circuit structure 10 and for convenience and ease of understanding the various components of the logic circuit are illustrated in electrical schematic form, it being understood that fabrication in integrated circuit form may readily be made by those skilled in the art. The integrated circuit structure 10 is comprised of a plurality of semiconductor regions and the various components and functions to be described are defined in the integrated circuit structure.

Figures 1, 2, 2A:
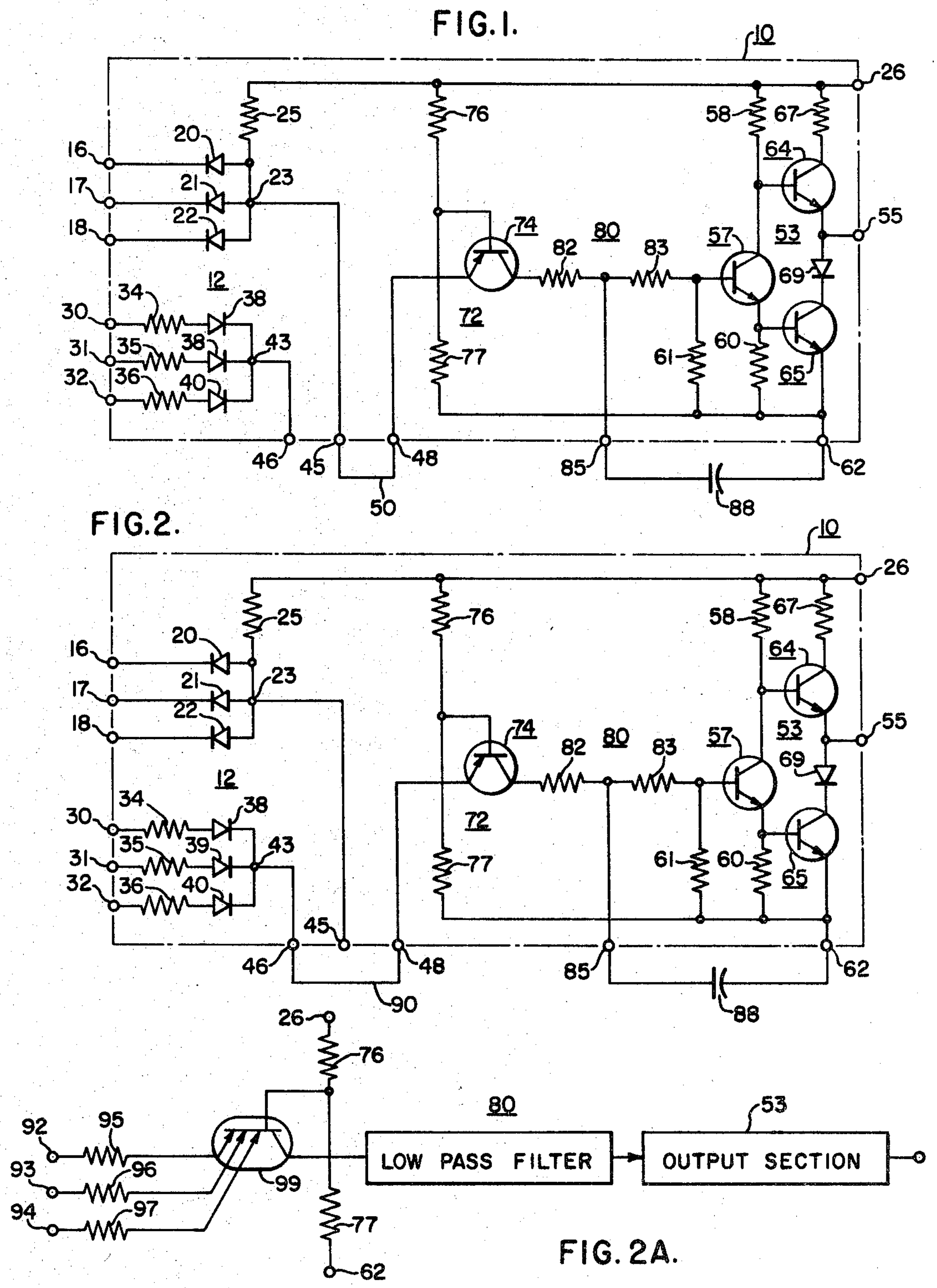
FIG. 1 illustrates an electrical schematic of one embodiment of the present invention, for providing an NAND function.
FIG. 2 illustrates an electrical schematic of one embodiment of the present invention, for providing a NOR function.
FIG. 2A illustrates a modification of a portion of the circuit of FIG. 2.

The logic circuit includes an input section 12 for receiving a plurality of input binary logic signals wherein a high voltage or high voltage range represents one binary state and a low voltage or low voltage range represents the other binary state. In order to provide for a universal logic gate, that is, a gate which is capable of performing a multiplicity of logic functions, the input section is comprised of a first input means for receiving NAND logic signals and a second input means for receiving NOR logic signals. The first input means includes a plurality of input terminals 16, 17 and 18 fabricated by well-known techniques on the integrated circuit structure 10. By way of illustration, the first input means additionally includes a plurality of input diodes 20, 21 and 22 each having a like electrode, the anode electrode, connected to an output common circuit point 23 which point is connected through resistor 25 to bias terminal 26 utilized for the application of a suitable operating potential. The second input means includes a plurality of input terminals 30, 31 and 32 for the application of NOR input logic signals with the input terminals being connected through resistors 34, 35 and 36 to respective diodes 38, 39 and 40, each having a like electrode, the cathode electrode, connected to an output common circuit point 43. Circuit point 23 and circuit point 43 are each connected to respective first and second integrated circuit terminals 45 and 46 whereby an external connection may be made to a third integrated circuit terminal 48, connected via circuit means to the output section 53, for selective operation of either the NAND input means or the NOR input means and in FIG. 1 the NAND function is chosen by the external lead means 50 connecting terminals 45 and 48.

The logic circuit includes an output section 53 which is responsive to the pattern or combination of input signals applied at terminals 16, 17 and 18 to switch between first and second operating states whereby in a first operating state or condition the output section may be regarded as on and conducting and in a second operating state or condition the output section may be regarded as off and nonconducting. Output means in the form of output terminal 55 is coupled to the output section 53 in order to provide an output logic signal in accordance with the operating condition of the output section.

The output section 53 is of a configuration well known to those skilled in the art and includes a first transistor 57 having its collector electrode connected through resistor 58 to bias terminal 26, its emitter electrode connected through resistor 60 and its base electrode, forming the input of output section 53, connected through resistor 61 to a point of reference potential in the form of ground terminal 62. The output section additionally includes second transistor 64 and third transistors 65 with the base electrode of transistor 64 being connected to the collector electrode of transistor 57, and the base electrode of transistor 65 being connected to the emitter electrode of 57. The collector electrode of transistor 64 is connected through resistor 67 to bias terminal 26 and the emitter electrode of transistor 65 is connected to ground terminal 62. A diode 69 is connected between the emitter electrode of transistor 64 and the collector electrode of transistor 65 with the output terminal 55 being connected to a point therebetween.

When transistor 57 is conducting, the voltage at the emitter electrode thereof is sufficiently high enough such that transistor 65 is in a conducting condition whereby the output signal at output terminal 55 is a low voltage representative of, for example, a binary zero. The voltages at the emitter and base electrodes of transistor 64 are such that said transistor is in an off condition. When transistor 57 is in a nonconducting condition, transistor 65 is also in a nonconducting condition and transistor 64 is in an on condition, whereby the output signal at output terminal 55 is a high voltage representative of binary one.

In operation, there may appear at input terminals 16, 17 and 18, or at other circuit points, noise signals having certain voltage values outside the range of the binary one or zero voltage values. In order that the output section 53 be nonresponsive to these various noise signals there is provided a threshold means 72 which includes transistor 74 having its base electrode connected to the junction between resistors 76 and 77 forming a voltage divider network connected between bias terminal 26 and ground terminal 62. There is, therefore, provided at the base electrode of transistor 74 a voltage for establishing a threshold and which voltage may be varied by selective variation of the value of resistor 77 and/or resistor 76. The emitter electrode of transistor 74 is connected to the the output circuit point 23 and transistor 74 is operable to be placed into a state of conduction to provide a signal at the collector electrode thereof when the voltage at its emitter electrode exceeds by a predetermined amount the voltage at its base electrode, the predetermined amount being substantially equivalent to the base-emitter voltage drop of the transistor 74.

The system which would utilize the logic circuit of FIG. 1 operates on binary one and zero signals of a certain minimum width or time duration. In operation, it sometimes happens that there arrears at various circuit points unwanted high frequency noise signals which could erroneously trigger the output section to an opposite conducting condition. Accordingly, there is provided a time delay means in the form of low pass filter network 80 which includes first and second resistance means in the form of resistors 82 and 83 incorporated into the integrated circuit structure 10 with the junction between the resistors 82 and 83 being connected to an integrated circuit terminal 85 whereby an external capacitor means such as capacitor 88 may be connected between the integrated circuit terminal 85 and the ground terminal 62 for completing the low pass filter network and for allowing for selective time delay by proper choice of capacitor value. By time delaying the output response, high frequency signals, that is signals of short time duration substantially less than the aforementioned minimum width, switch binary states at a rate too fast for proper output section responses and are therefore effectively filtered out by the low pass filter network 80. Present technology of integrated circuit fabrication limits the values of integrated circuit capacitors to an upper limit of about 200 to 300 picofarads. Where several hundred picofarads is enough to provide a sufficiently desired time delay, or where technology advances to a point where higher valued capacitors may be made in integrated circuit form, the capacitor 88 could be incorporated into the integrated circuit structure 10.

In operation, and by way of example, assume that input terminal 16 receives a binary zero input signal and input terminals 17 and 18 receive binary one input signals. With the low voltage at the cathode electrode of diode 20, a current path is established from bias terminal 26, through resistor 25, through diode 20 to a previous stage supplying the binary zero signal, whereby the voltage established at output circuit point 23, and accordingly at the emitter electrode of transistor 74, is insufficient to turn the transistor 74 on due to the voltage applied to the base electrode thereof by resistors 76 and 77 of the voltage divider network. Accordingly, transistor 57 of the output section 53 is in an off condition whereby a binary one output signal is provided at the output terminal 55. If a positive voltage below the threshold set by the threshold means 72 appears at the input terminal 16 due to, for example, an inductive coupling from a piece of machinery in the system being controlled, it will have no affect on the operating condition of the output section 53. If a legitimate binary one signal appears at the input terminal 16 each of the diodes 20, 21 and 22 will be blocked such that the circuit point 23 experiences a rise in voltage until such point that the emitter electrode voltage exceeds the base electrode voltage of transistor 74 by a predetermined amount to turn the transistor 74 on whereby the resulting output signal at the collector electrode thereof is fed through the low pass filter network 80 to turn on the transistor 57 to place the output section 53 into its conducting condition whereby a binary zero output signal is provided at the output terminal 55. If the voltage at one of the input terminals 16, 17 or 18 should decrease in value due to one or more noise producing factors, the threshold means 72 insures that the output section 53 remains in its conducting condition such that the erroneous input signal has no affect thereon. (Provided of course that the decrease in voltage does not bring the input terminal down to a value of a true binary zero.)

The time delayed response of the output section 53 to input signals is governed, in part, by the values of resistors 25 and 61, and the values of the low pass filter network components, that is resistors 82 and 83 and capacitor 88. By way of example and to a good approximation, when the input signals to input terminals 16, 17 and 18 become all binary ones, the voltage across capacitor 88, that is the voltage at terminal 85 with respect to ground, builds up exponentially as determined by charging current through resistor 25, through transistor 74, and through resistor 82. Charging current however, also passes through resistors 83 and 61 in series such that the resulting time constant is RC, where C is the value of capacitor 88 and R is the equivalent value of the serially connected resistors 25 and 82 in parallel with the serially connected resistors 83 and 61. As the voltage across capacitor 88 builds up, a point is reached where the output section 53 commences to turn on and therefore it is seen that the time delayed response of the output section to all binary one input signals is governed by the value of RC.

When one or more binary zero signals are applied to the input section, transistor 74 turns off and discharge paths for the capacitor are established through resistor 83 and through the base-emitter diodes of transistors 57 and 65 as well as the through resistor 61 and 60, to ground, until the voltage decreases to a point where the output section 53 turns off and discharge is completed through resistors 83 and 61 to ground. The time delayed response wherein the output section 53 turns off due to one or more binary zero input signals is governed by the time constant R′ C where C is the value of capacitor 88 and R′ is equivalent to the value of resistor 83 (and any internal diode resistance of the base emitter diodes of transistor 57 and 65 combined with resistors 61 and 60). The values of circuit components are chosen or fabricated in order to provide for a somewhat symmetrical response time, that is, if the time delayed response of the output section 53 to all binary one input signals is Y and the response thereafter to one or more zero input signals is Y′, then it is desired that the ratio of Y to Y′ be in the order of two to one or less.

In one test of the circuit of FIG. 1 the value of the resistors and capacitor involved in the time delay were as follows:

Resistor 25 — 13 kilohms

Resistor 82 — 6 kilohms

Resistor 83 — 2 kilohms

Resistor 61 — 10 kilohms

Capacitor 88 — 0.03 microfarads With a supply voltage of 12 volts and resistor values of 4 kilohms and 2 kilohms for resistors 76 and 77, the turn-on delay was calculated to be 112 microseconds and the turn-off delay was 105 mircoseconds.

FIG. 2 includes the identical integrated circuit structure 10 as in FIG. 1, and illustrates the connections for providing a NOR gate, that is, external lead means 90 is provided connecting the integrated circuit terminals 46 and 48 such that the voltage at circuit point 43 is applied to the emitter electrode of transistor 74.

In operation, with all binary zeros being applied to the input terminals, 30, 31 and 32, the voltage at circuit point 43 is insufficient to overcome the threshold to turn on the transistor 74. If one or more of the input terminals 30, 31 or 32 receives a binary one input signal, the voltage at circuit point 43 rises to a value, governed in part by the value of resistor 34, or 35, or 36, whereby the voltage at the emitter electrode of transistor 74 exceeds the threshold of the threshold voltage at the base thereof to turn on the transistor 74, in turn placing the output stage into its first or conducting condition whereby the output signal at the output terminal 55 is a binary zero.

With the integrated circuit structure 10 of FIGS. 1 or 2 there may be provided either a NAND or NOR function by the simple expedient of connecting an external lead means from the integrated circuit terminal 48 to either terminal 45 or 46. It is obvious that these latter integrated circuit terminals may be eliminated simply by making one type of integrated circuit wherein circuit point 23 is connected directly to the emitter electrode of transistor 74, for providing the NAND function and fabricating a second type of integrated circuit wherein the circuit point 43 is connected directly to the emitter electrode of transistor 74 to implement the NOR function. Another type of input for implementing the NOR function is illustrated in FIG. 2A to which reference is now made.

In FIG. 2A there is illustrated voltage divider resistors 76 and 77 serially connected between bias terminal 26 and ground terminal 62. A plurality of input terminals 92, 93 and 94 are provided for receiving input logic signals and are connected through respective resistors 95, 96 and 97 to a respective emitter of a PNP multiemitter transistor 99 the base electrode of which is connected to the junction between resistors 76 and 77 and the collector electrode of which provides a signal to the low pass filter 80 which time delays the signal by a predetermined duration prior to application to the output section 53. The conduction of the PNP multiemitter transistor 99 is dependent upon the difference in voltage between an emitter and base electrode thereof and accordingly it is seen that the PNP multiemitter transistor 99 forms not only an input means but in addition performs the function of a threshold means.

The time delayed response of the output section 53 in the NOR circuit of FIG. 2 or FIG. 2A is governed not only by the resistors of the time delay means but by resistors 34, 35 or 36 in FIG. 2 and 95, 96 and 97 in FIG. 2A, in addition to any resistors in the charging path from a previous stage.

The capacitor voltage buildup, for example due to a binary one input signal at input terminal 30 is the result of charging current from a previous stage, applied through resistor 34, diode 38, transistor 74, and resistor 82 to capacitor 88. Discharge of the capacitor voltage, in response to all binary zero inputs is the same as described with respect to the operation of FIG. 1. Component valves are chosen, as was the case with respect to FIG. 1, to provide for a reasonably symmetrical response time of the output section 53.

Figure 3:
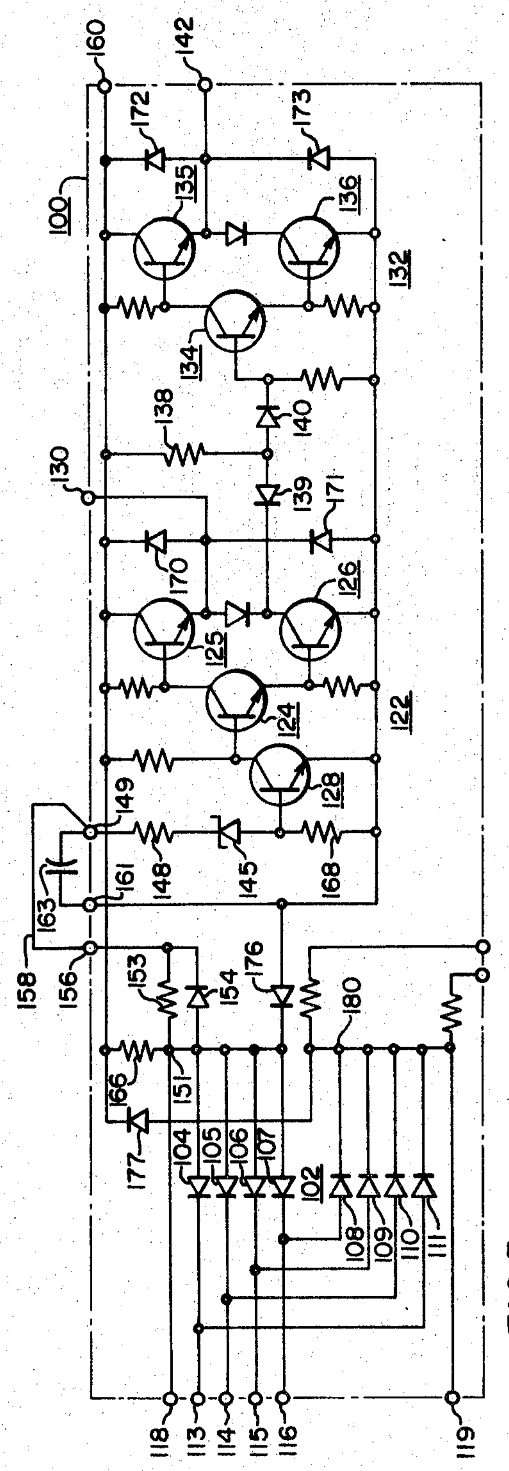
FIG. 3 illustrates an electrical schematic of another embodiment of the present invention, for providing an NAND function.

Referring now to FIG. 3, the integrated circuit structure 100 includes an input section 102 including a first plurality of diodes 104, 105, 106 and 107 for use in a NAND embodiment and a second plurality of diodes 108, 109, 110 and 111 for use in a NOR embodiment. Each of the first plurality of diodes is connected to a respective input terminal 113, 114, 115 and 116 and in order to reduce the number of total integrated circuit terminals needed, each of the second plurality of diodes is also connected to a respective one of the input terminals. Input terminal 118 is provided in a well known manner for connection of additional diodes to expand the NAND input capabilities and input terminal 119 is provided to expand the NOR input capabilities.

The output section 122 includes three transistors 124, 125 and 126 in an arrangement similar to the output section of FIGS. 1 and 2. In addition, the output section includes a fourth transistor 128 which is provided for amplification purposes in order to speed up switching of transistors 124 and 125 and 126. An output terminal 130 is electrically connected to be responsive to the condition of the output section 122 for providing an output logic signal which is the end function of the input signals. In order to provide a NAND function there is additionally provided other output means in the form of an inverter stage 132 including a plurality of transistors 134, 135 and 136 arranged in a configuration similar to the output section 53 of FIGS. 1 and 2 and connected to be responsive to the output section 122 through coupling means including resistor 138 and diodes 139 and 140 in a manner well known to those skilled in the art. An output signal from the output means 132 is provided at the output terminal 142.

The threshold means for the logic circuit comprises a voltage breakdown device in the form of a Zener diode 145 having its anode electrode connected to the base electrode of transistor 128 and its cathode electrode connected through resistor 148 to the integrated circuit terminal 149.

Each of the anode electrodes of the NAND input diodes is connected to a common circuit point 151 which is connected through the parallel combination of resistor 153 and diode 154 to the integrated circuit terminal 156 whereby external lead means 158 connecting integrated circuit terminals 156 and 149 transforms the logic circuit into an AND (output at terminal 130) or NAND (output at 142) gate.

For application of proper bias potential there is provided a bias terminal 160 and, as a point of reference potential, integrated circuit terminal 161 forms the circuit ground.

As was the case with respect to FIG. 1, there is interposed between the input section 102 and the output section 122 a time delay means in the form of a low pass filter network which includes capacitor 63 externally connected between integrated circuit terminals 149 and 161. Upon the application of all binary one input signals, charging current supplied at the bias terminal 160 flows through resistor 166 through diode 154 to charge up the capacitor 163. The voltage buildup on the capacitor continues with a time constant dependent upon the value of resistor 166 and value of capacitor 163 and at some point in the voltage buildup process the voltage threshold of the Zener diode 145 is exceeded such that sufficient base current is supplied to the transistor 128 to switch it from its off to its conducting condition. The transition to the conducting condition places the previously conducting transistor 124 into its off condition such that the voltage at output terminal 130 is high, representative of a binary one. With transistor 126 also in an off condition current flows through resistor 138 and diode 140 to supply base current to the output means 132 to turn it on such that the output signal at output terminal 142 is a low voltage indicative of a binary zero output.

When one or more of the input signals reverts to binary zero, current discharges from the capacitor, passes back through resistor 153 (it is unable to pass in a reverse direction through diode 154) and through the diode or diodes receiving the binary zero signal. Current is also discharged through resistor 148, through Zener diode 145 and through the base-emitter diode of transistor 128, until such point where the voltage across the capacitor 163 can no longer sustain the Zener diode 145 in the breakdown condition whereupon transistor 128 reverts to its off condition. For a short while there exists a small discharge current through the resistor 148, Zener diode 145 and the resistor 168 to ground, while the bulk of the remaining current continues its discharge through resistor 153 and through the diode or diodes receiving the binary zero input. Depending upon the supply voltages, breakdown voltage of Zener diode 145, and component values, the response of the output section 122 to the appearance of one or more binary zero input signals is only after a certain time delay. The response of the output section 122 to the appearance of all binary one input signals is also after a certain time delay and it is desired to maintain these two time delays within acceptable ratios, and accordingly the diode 154 constitutes means for bypassing or eliminating resistor 153 during charging conditions while placing 153 in circuit for discharge conditions in order to achieve the said desired ratio.

In operation it is possible that unwanted reverse voltages or excessive direct voltages appear at various points in the circuit, of sufficiently high value to destroy one or more circuit components. Accordingly reverse voltage and overvoltage protection means are provided in the form of diodes 170, 171, 172 and 173 connected across respective transistors 125, 126, 135 and 136 in order to limit the reverse voltage thereacross. Diodes 170 and 172 are connected with the polarity illustrated between the bias terminal 160 and a respective output terminal 130 or 142, while diodes 171 and 173 are connected between the respective output terminal 130 or 142 and ground potential. Additional diodes 176 and 177 are similarly used to protect the input circuit against unduly high reverse voltages or over voltages caused by transients or the like.

Diode 176 is connected between ground potential and the common circuit point 151 while diode 177 is connected between the bias potential at terminal 160 and the common circuit point 180.

Figure 4:
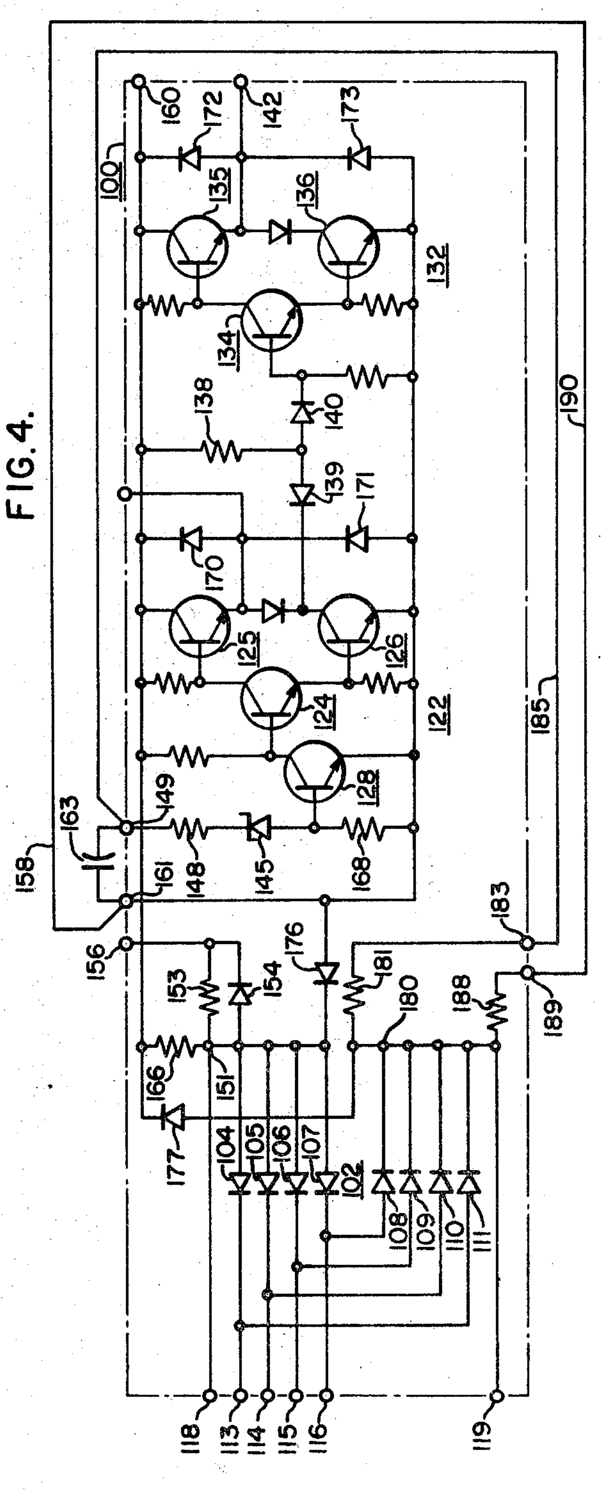
FIG. 4 illustrates an electrical schematic of another embodiment of the present invention, for providing an NOR function.

The integrated circuit structure of FIG. 4 is identical to the integrated circuit structure of FIG. 3 and accordingly the components have been given the same reference numerals. In the OR-NOR circuit of FIG. 4, the second plurality of diodes 108, 109, 110 and 111 have their cathode electrodes connected to a common circuit point 180 which is connected through resistor 181 to an integrated circuit terminal 183. External lead means 185 connects the integrated circuit terminals 183 and 149 such that the input signals may be coupled to the output section 122.

Completing the input circuit for the OR-NOR gate is a resistor 188 connected to the integrated circuit terminal 189 thence to ground terminal 161 by means of external lead means 190. With the application of one or more input binary one signals, capacitor 163 charges up by the current flowing through resistor 181 from a previous stage, and in so doing a point is reached whereby the transistor 128 turns on, resulting in an OR output signal at output terminal 130 and a NOR output signal at output terminal 142. When all of the input signals again revert to a binary zero the capacitor discharges through resistor 181, and through resistor 188 to ground and for some portion of the capacitor discharge, current flows through resistor 148, through Zener diode 145 and through the base-emitter diode of transistor 128 until such point is reached where the Zener diode 145 no longer conducts current and the remainder of the discharge is through resistors 181 and 188.

Although the present invention has been described with a certain degree of particularity, it should be understood that the present disclosure has been made by way of example and that modifications and variations of the logic circuit presented herein are made possible in the light of the above teachings.

We claim:

1. A control logic circuit, comprising:
   a. an input section for receiving a plurality of binary input signals having a minimum pulse width;
   b. an output section operable in a first and second operating condition and being responsive to said input logic signals for assuming one of said operating conditions as determined by predetermined combinations of said input logic signals;
   c. output means coupled to said output section for providing an output logic signal in accordance with the operating condition of said output section;
   d. a low pass filter network connected in circuit between said input and output sections, for filtering out noise signals of short time duration substantially less than said minimum pulse width; and
   e. threshold means for limiting the response of said output section to only those input logic signals within predetermined binary voltage ranges.

2. A circuit according to claim 1 wherein:
   a. the threshold means includes:
      1. a voltage divider network,
      2. a transistor having:
         i. a base electrode for connection to said voltage divider network;
         ii. an emitter electrode for connection to the input section; and
         iii. a collector electrode for providing a signal when the voltage at said emitter electrode exceeds the voltage at said base electrode by a predetermined amount.

3. A circuit according to claim 1 wherein:
   a. the input section includes:
      1. first input means having a plurality of input terminals connected through first circuit means to a first common circuit point;
      2. second input means having a plurality of input terminals connected through second circuit means to second common circuit point; and which additionally includes:
   b. a first circuit terminal electrically connected to said first common circuit point;
   c. a second circuit terminal electrically connected to said second common circuit point;
   d. a third circuit terminal electrically connected to the output section, whereby selective utilization of one of said input means may be accomplished by selective connection of said third circuit terminal with one of the other two said circuit terminals.

4. A circuit according to claim 1 wherein:
   a. the low pass filter network includes at least:
      1. first resistance means,
      2. second resistance means connected to said first resistance means,
      3. capacitor means connected between the junction between said first and second resistance means and a point of reference potential; and
      4. diode means connected in parallel circuit relationship with said first resistance means.

5. A circuit according to claim 1 wherein:
   a. the output means includes:
      1. an output terminal for providing an AND output signal, and
      2. an inverter stage for providing a NAND output signal.

6. A circuit according to claim 1 wherein:
   a. the output means includes:
      1. an output terminal for providing an OR output signal; and
      2. an inverter stage for providing a NOR output signal.

7. A circuit according to claim 2 wherein:
   a. the low pass filter network is connected in circuit between the collector electrode of the transistor and the input to the output section.

8. A circuit according to claim 7 wherein:
   a. the low pass filter network means includes:
      1. first resistance means connected to the collector electrode of the transistor;
      2. second resistance means connected between said first resistance means and the input to the output section; and
      3. capacitor means connected between the junction between said first and second resistance means, and a point of reference potential.

9. A circuit according to claim 4 wherein:
   a. the threshold means includes a voltage breakdown device connected between the second resistance means and the input to the output section.